(12) United States Patent
Woody et al.

(10) Patent No.: US 9,045,596 B2
(45) Date of Patent: Jun. 2, 2015

(54) METHOD OF PURIFYING CONJUGATED POLYMERS

(71) Applicant: PHILLIPS 66 COMPANY, Houston, TX (US)

(72) Inventors: Kathy Beckner Woody, Bartlesville, OK (US); Amit Palkar, Bartlesville, OK (US); Joe E. Bullock, Bartlesville, OK (US)

(73) Assignee: Phillips 66 Company, Houston, TX (US)

( * ) Notice: Subject to any disclaimer, the term of this patent is extended or adjusted under 35 U.S.C. 154(b) by 0 days.

(21) Appl. No.: 14/172,439

(22) Filed: Feb. 4, 2014

(65) Prior Publication Data

US 2014/0221590 A1    Aug. 7, 2014

Related U.S. Application Data

(60) Provisional application No. 61/760,774, filed on Feb. 5, 2013.

(51) Int. Cl.
| | | |
|---|---|---|
| *C08G 61/00* | (2006.01) | |
| *C08G 85/00* | (2006.01) | |
| *C08G 75/00* | (2006.01) | |

(52) U.S. Cl.
CPC ............ *C08G 75/00* (2013.01); *C08G 2261/18* (2013.01); *C08G 2261/712* (2013.01); *C08G 2261/71* (2013.01); *C08G 2261/00* (2013.01)

(58) Field of Classification Search
CPC .................... C08G 2261/71; C08G 2261/712; C08G 2261/00
USPC ........ 528/502 R, 377, 380; 526/256; 524/448
See application file for complete search history.

(56) References Cited

U.S. PATENT DOCUMENTS

| | | | | |
|---|---|---|---|---|
| 6,368,732 | B1 * | 4/2002 | Jin et al. ................... | 428/690 |
| 6,858,161 | B2 * | 2/2005 | Abe et al. ................. | 252/500 |
| 7,507,351 | B2 * | 3/2009 | Tsuda et al. ............. | 252/301.16 |
| 7,524,922 | B2 | 4/2009 | Heeney et al. | |
| 8,242,235 | B2 * | 8/2012 | Tsuda et al. ............. | 528/490 |
| 8,247,803 | B2 * | 8/2012 | Choi et al. ................ | 257/40 |
| 8,367,798 | B2 * | 2/2013 | Yang et al. .............. | 528/380 |
| 8,372,945 | B2 * | 2/2013 | Hou et al. ................ | 528/377 |
| 8,436,134 | B2 * | 5/2013 | Yu et al. ................... | 528/377 |
| 8,968,885 | B2 * | 3/2015 | Brown et al. ............ | 428/690 |
| 2011/0204341 | A1 * | 8/2011 | Brown et al. ............ | 257/40 |
| 2012/0085992 | A1 * | 4/2012 | Beaujuge et al. ........ | 257/40 |
| 2013/0056071 | A1 | 3/2013 | Palkar et al. | |

FOREIGN PATENT DOCUMENTS

| | | | | |
|---|---|---|---|---|
| WO | WO 2008/100084 A1 * | 8/2008 | ............ | H01L 29/786 |
| WO | WO 2010/008672 A1 * | 1/2010 | ............ | C08G 75/00 |

OTHER PUBLICATIONS

Pasto, D.J. and C.R. Johnson. Laboratory Text for Organic Chemistry. Englewood Cliffs, NJ: Prentice Hall, Inc., 1979, p. 56.*
Lou, X.; Janssen, H.-G.; Cramers, C.A. Anal. Chem. 1997, 69, 1598-1603.*
Xianwen Lou, Hans-Gerd Janssen, and Carel A. Cramers, "Parameters Affecting the Accelerated Solvent Extraction of Polymeric Samples", Laboratory of Instrumental Analysis, Eindhoven University of Technology, Analytical Chemistry, vol. 69, No. 8, Apr. 15, 1997, pp. 1598-1603.

* cited by examiner

*Primary Examiner* — Rip A Lee
(74) *Attorney, Agent, or Firm* — Phillips 66 Company (57) ABSTRACT

A method of first dissolving a conjugated polymer in a fluid followed by adding an agent to the fluid and evaporating the fluid to produce a solid sample. The solid sample is then ground to produce a fragmented solid sample. This is followed by performing solvent extraction on the fragmented solid sample at elevated temperature and pressure to produce a purified conjugated polymer in a solvent.

11 Claims, 8 Drawing Sheets

SYNTHESIS OF N,N-diethylphenylazothioformamide

METHOD OF PURIFYING CONJUGATED POLYMERS

CROSS-REFERENCE TO RELATED APPLICATIONS

This application is a non-provisional application which claims the benefit of and priority to U.S. Provisional Application Ser. No. 61/760,774 filed Feb. 5, 2013, entitled "Method of Purifying Conjugated Polymers," which is hereby incorporated by reference in its entirety.

STATEMENT REGARDING FEDERALLY SPONSORED RESEARCH OR DEVELOPMENT

None.

FIELD OF THE INVENTION

This invention relates to a method of purifying conjugated polymers.

BACKGROUND OF THE INVENTION

Conducting polymers, or polymers that have conjugation in their backbone, can be used in many commercial applications including for example OLEDs, PLEDs, photovoltaic cells, transistors, sensors, organic solar cells, and the like. They are ideal for these uses since they are easily tunable and have their ability to be produced through a solution process leads to low-cost fabrication.

In many cases, commercial applications compel that these polymers be free of metallic impurities. For example, nickel, palladium, ruthenium and zinc represent typical impurities that can be present in conjugated polymers. Trace amounts of these metals are detrimental to organic electronic device performance. Conducting polymers can aggregate and trap these impurities making them difficult to remove. Palladium is the most common catalyst used in preparing conjugated polymers and may stubbornly persist in the material despite careful workup and extensive efforts to purify the polymers.

Several methods have been commonly used to purify conjugated polymers including precipitation, preparatory scale gel permeation chromatography, column chromatography using silica gel and Soxhlet extraction. Each of these methods has drawbacks and limitations in association with conjugated polymer purification, including amount of time and solvent required, scalability of the process and lack of reduction in impurities and oligomers.

One commonly used method is precipitation of the polymers, or adding a solution of the polymer to a "bad" solvent to generate the polymer as a precipitate. While this method is quick and does not generate large amounts of solvent waste, precipitation is largely ineffective at removing impurities and low molecular weight oligomers.

Preparatory scale gel permeation chromatography is a size exclusion chromatography method, thus this method can easily be used to remove low molecular weight oligomers from the polymer. However, only small amounts of polymer (<15 mg) can be purified at one time. Silica gel chromatography has also been used in effort to purify conjugated polymers; however it is unclear how effective this technique is at reducing impurities. In addition, the polymers often adhere to the silica gel resulting in a large loss of product. Each of these chromatography methods generate large amounts of solvent waste, does not fully remove metal impurities, and are not practical for industrial applications.

Another popular technique for purifying conjugated polymers is the use of a Soxhlet extractor, where the polymer is washed repeatedly with a series of hot solvents. Solvents that will not dissolve the polymer such as methanol and acetone are used in effort to remove impurities, and solvents such as hexanes are used to dissolve low molecular weight oligomers. Finally, a solvent such as chloroform is used to dissolve the polymer. A Soxhlet extraction involves a large investment of time to thoroughly wash the polymers, generally 24-48 hours for each type of solvent wash. Soxhlet extraction is not an effective method for fully removing metal impurities trapped in the polymers.

A general need exists to find a versatile, inexpensive, convenient, commercially attractive method to purify conjugated polymers.

BRIEF SUMMARY OF THE DISCLOSURE

A method of first dissolving a conjugated polymer in a fluid followed by adding an agent to the fluid and evaporating the fluid to produce a solid sample. The solid sample is then ground to produce a fragmented solid sample. This is followed by performing solvent extraction on the fragmented solid sample to produce a purified conjugated polymer in a solvent.

In another embodiment the method also describes dissolving a conjugated polymer in a solvent and adding an agent to the solvent to produce a solid sample. The solid sample is then ground to produce a fragmented solid sample. A three stage solvent extraction at an elevated temperature and an elevated pressure for less than six hours on the fragmented solid sample is then performed with three different solvents. This produces a purified conjugated polymer in a solvent that is at least 80 wt % of the conjugated polymer.

BRIEF DESCRIPTION OF THE DRAWINGS

A more complete understanding of the present invention and benefits thereof may be acquired by referring to the follow description taken in conjunction with the accompanying drawings in which.

DETAILED DESCRIPTION

Turning now to the detailed description of the preferred arrangement or arrangements of the present invention, it should be understood that the inventive features and concepts may be manifested in other arrangements and that the scope of the invention is not limited to the embodiments described or illustrated. The scope of the invention is intended only to be limited by the scope of the claims that follow.

A method of first dissolving a conjugated polymer in a fluid followed by adding an agent to the fluid and evaporating the fluid to produce a solid sample. The solid sample is then ground to produce a fragmented solid sample. This is followed by performing solvent extraction on the fragmented solid sample to produce a purified conjugated polymer in a solvent.

EXAMPLES

Figure 1:
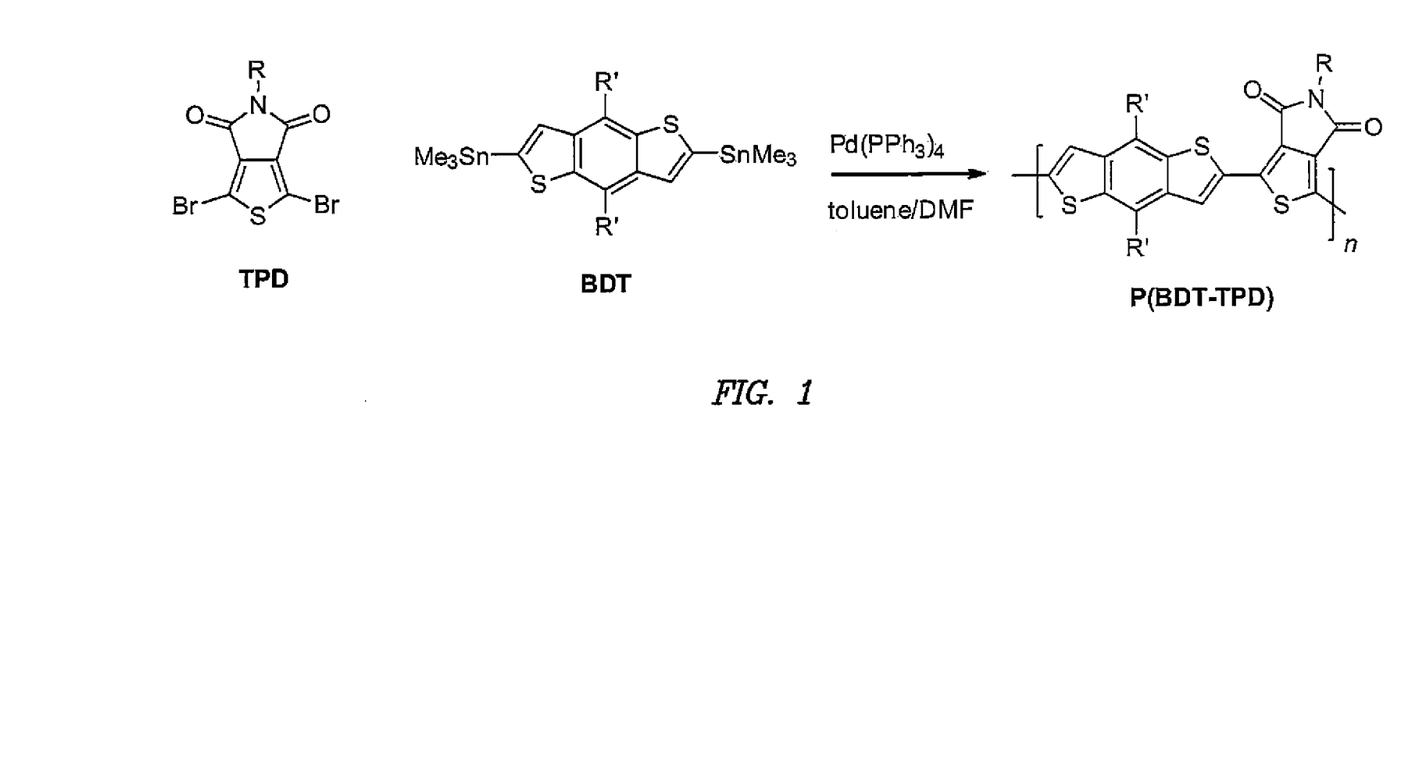
FIG. 1 depicts the conjugated polymer of P(BDT-TPD).
Figure 2:
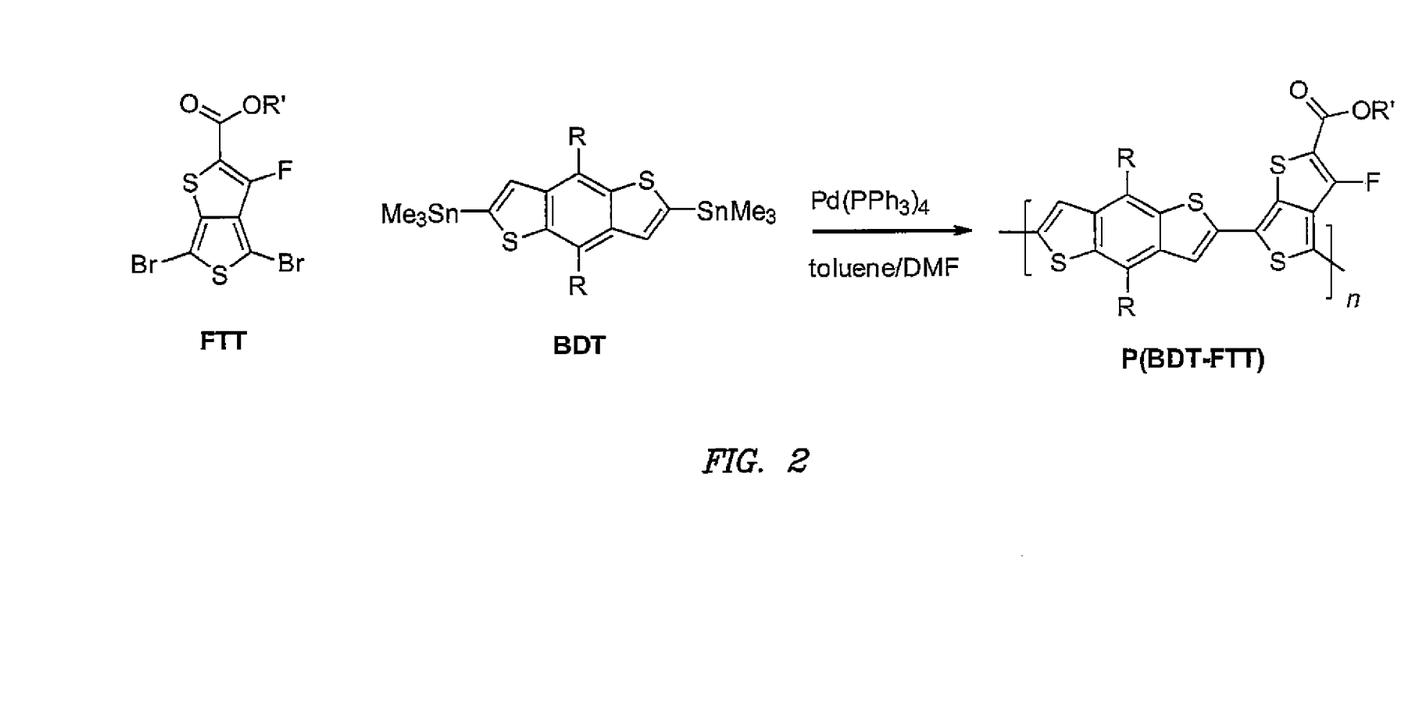
FIG. 2 depicts the conjugated polymer of P(BDT-FTT).

In each of these examples conjugated polymers of P(BDT-TPD) and P(BDT-FTT) were used, FIG. 1 depicts one method of polymerizing two monomers to produce P(BDT-TPD). FIG. 2 depicts one method of polymerizing two monomers to produce P(BDT-FTT). During the course of the polymerization 5 mol % of tetraakis(tripheylphosphine)palladium (0) [Pd(PPh$_3$)$_4$] was added to the reaction mixture.

Example 1

Precipitation

P(BDT-TPD) (0.039 g) was taken up in chloroform (20 mL) and precipitated into MeOH(100 mL). The solid polymer was collected by gravity filtration and dried under vacuum. This resulted in an overall recovery of 0.038 g, or 98% yield.

P(BDT-FTT) was taken up in chloroform (20 mL) and precipitated into MeOH (100 mL). The solid polymer was collected by gravity filtration and dried under vacuum.

The palladium content of the polymer sample before and after precipitation are shown in Table 1.

TABLE 1

| Polymer Sample | Amt (ppm) | % Pd remaining |
|---|---|---|
| P(BDT-TPD) | | |
| Initial Content | 6040 | |
| Precipitation 1 | 2600 | 43% |
| Precipitation 2 | 4100 | 68% |
| P(BDT-FTT) | | |
| Initial Content | 6250 | |
| Precipitation 1 | 5500 | 88% |
| Precipitation 2 | 6250 | 100% |

Example 2

Soxhlet Extraction

Figure 3:
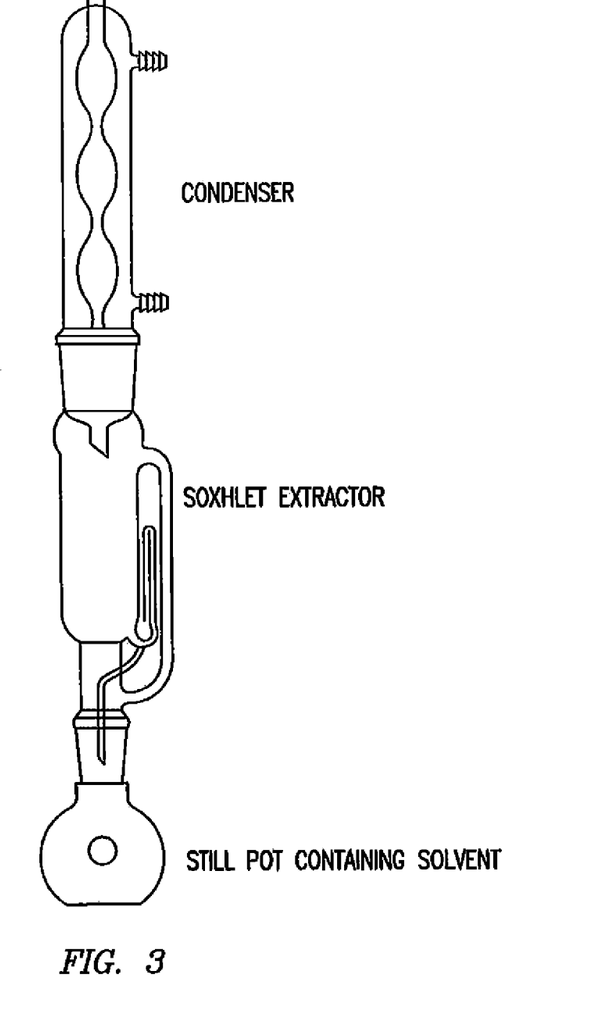
FIG. 3 depicts an example of a Soxhlet extraction device.

A Soxhlet extraction was used to purify the conjugated polymers of P(BDT-TPD) and P(BDT-FTT). An example of a Soxhlet extraction device is depicted in FIG. 3 in a forward cross section view.

P(BDT-TPD) (0.121 g) was placed in a cellulose thimble and subjected to sequential extraction with acetone, hexanes and chloroform. For the first extraction, acetone (200 mL) was heated to reflux for 24 hours, followed by hexanes (200 mL) for 24 hours and then chloroform (200 mL) for 24 hours. The polymer was then extracted into the chloroform fraction. The solvents were removed from each fraction under reduced pressure using a rotary evaporator. The following amounts of samples were recovered from: acetone 0.007 g, hexane 0.030 g and chloroform 0.082 g. This resulted in an overall recovery of 0.119 g, or 98% yield.

P(BDT-FTT) was placed in a cellulose thimble and subjected to sequential extraction with acetone, hexanes and chloroform. For the first extraction, acetone (200 mL) was heated to reflux for 24 h, followed by hexanes (200 mL) for 24 h and then chloroform (200 mL) for 24 h. The polymer was extracted into the chloroform fraction. The solvents were removed from each fraction under reduced pressure using the rotoevaporator.

The palladium content of the polymer sample before and after precipitation are shown in Table 2.

TABLE 2

Summary of palladium content before and after Soxhlet extraction.

| Polymer Sample | Amt (ppm) | % Pd remaining |
|---|---|---|
| P(BDT-TPD) | | |
| Initial Content | 6040 | |
| Soxhlet Extraction 1 | 2720 | 45% |
| Soxhlet Extraction 2 | 2909 | 48% |
| P(BDT-FTT) | | |
| Initial Content | 6250 | |
| Soxhlet Extraction 1 | 4800 | 77% |
| Soxhlet Extraction 2 | 4155 | 66% |

Example 3

Treatment with N,N-diethylphenylazothioformamide

Figure 4:
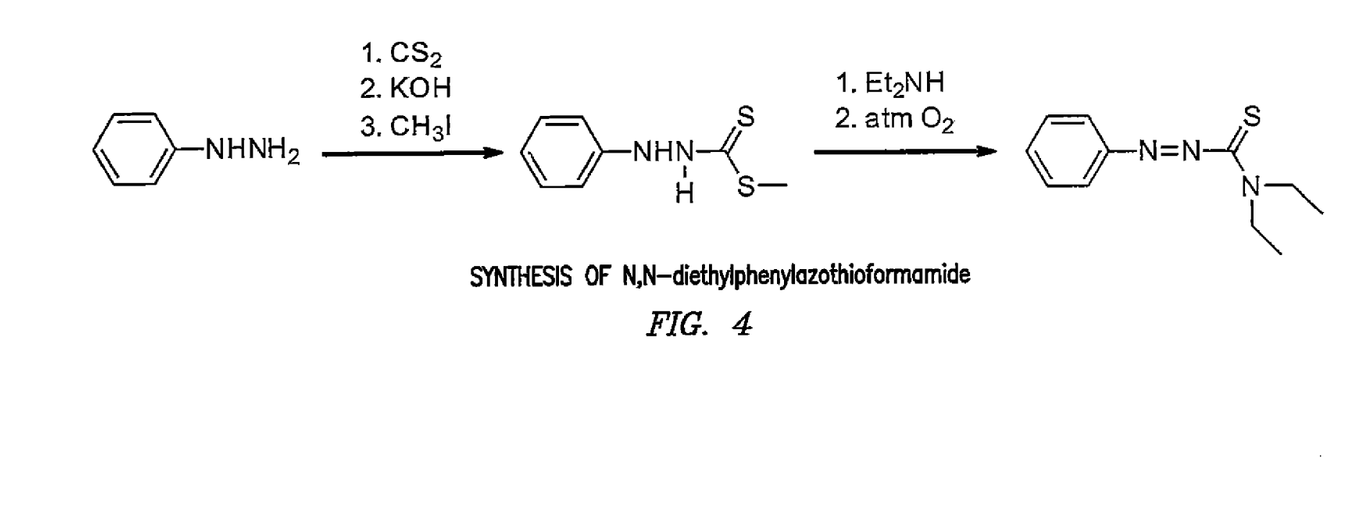
FIG. 4 depicts the synthesis of N,N-diethylphenylazothioformamide.

A method of forming N,N-diethylphenylazothioformamide is shown in FIG. 4. N,N-diethylphenylazothioformamide (17.1 mg) was added to a solution of P(BDT-TPD) (61 mg) and anhydrous THF (10 mL) and heated to 60° C. for 2 hours. The solution was cooled to room temperature and poured into MeOH (50 mL) and filtered. The resulting solid residue was washed with acetone and hexanes and collected in chloroform. The solid was reprecipitated from acetone (100 mL) twice to afford the polymer as a purple solid (55 mg, 90% yield). A GCMS headspace analysis of the polymer indicated that N,N-diethylphenylazothioformamide remained in the polymer as a contaminant after treatment and efforts to purify.

A summary of the palladium content of P(BDT-TPD) and P(BDT-FTT) after treatment with N,N-diethylphenylazothioformamide are shown in Table 3.

TABLE 3

| Polymer Sample | Amt (ppm)* | % Pd remaining |
|---|---|---|
| P(BDT-TPD) | | |
| Initial | 6040 | |
| After treatment | 550 | 9% |
| After treatment | 670 | 10% |
| P(BDT-FTT) | | |
| Initial | 6250 | |
| After Treatment | 4470 | 72% |
| After Treatment | 3860 | 62% |

Example 4

SiliaBond® Metal Scavengers

Figure 5:
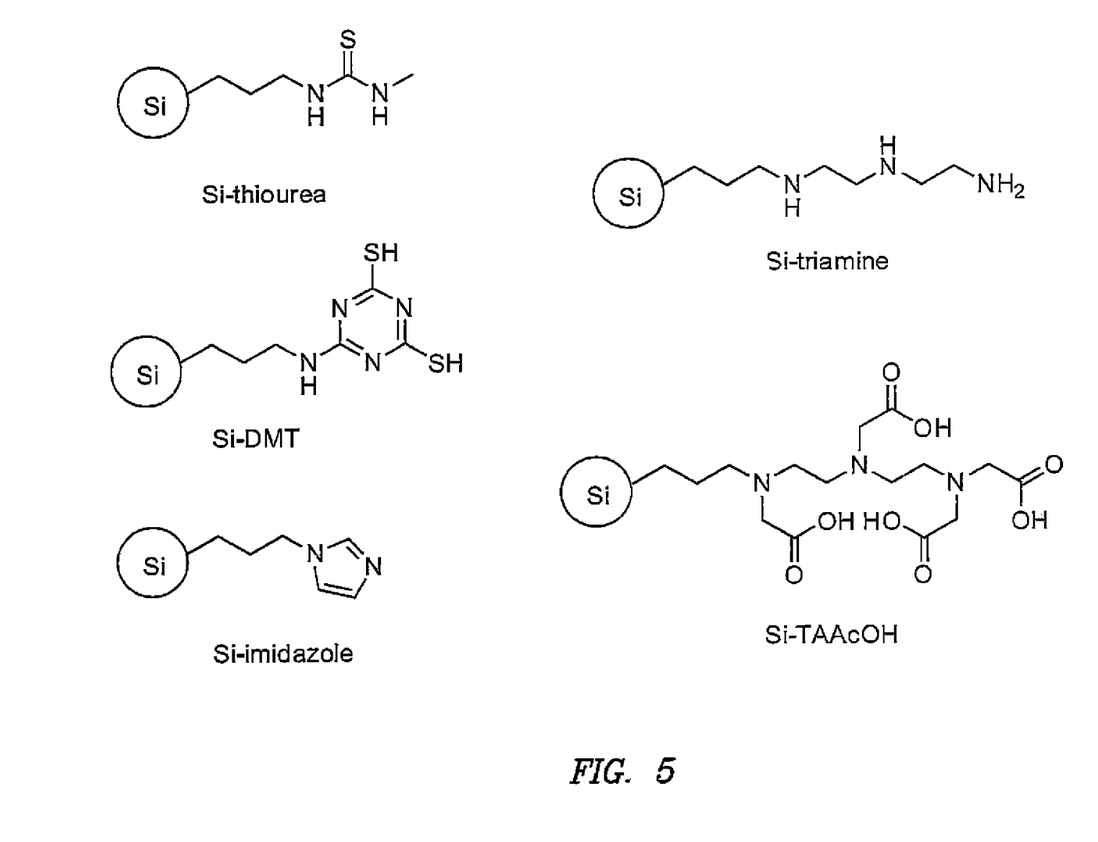
FIG. 5 depicts various SiliaBond® metal scavengers.

The SiliaBond® metal scavengers, such as those shown in FIG. 5 were used to recover palladium from P(BDT-TPD).

On example of a SiliaBond metal scavenger used involves adding Si-DMT (0.47 g) to a solution of P(BDT-TPD) (50.7 mg) in anhydrous chlorobenzene (15 mL) and heated to 120° C. for 24 hours. The solution was cooled to room temperature and poured through a course glass fritted funnel. The solid Si-DMT residue was washed with chloroforin (200 mL). The solvent was removed under reduced pressure using a rotary evaporator and precipitated from MeOH (100 mL). The solid was collected by filtration to afford the polymer as a purple solid (48.8 mg, 96% yield).

The palladium content of the P(BDT-TPD) polymer sample before and after contact with the SiliaBond metal scavengers of FIG. 5 at 60° C. for 24 hours is shown in Table 3.

Summary of Palladium Content of P(BDT-TPD) after Treatment at 60° C. for 24 Hours with Five Different SiliaBond Metal Scavengers

TABLE 4

| P(BDT-TPD) polymer sample | Amount (ppm) | % Pd remaining | % Recovery of Polymer |
|---|---|---|---|
| Initial | 2600 | — | N/A |
| Si-TAAcOH | 2300 | 88% | 96% |
| Si-thiourea | 880 | 33% | 94% |
| Si-triamine | 760 | 29% | 95% |
| Si-DMT | 720 | 27% | 97% |
| Si-imidazole | 2500 | 96% | 94% |

The palladium content of the P(BDT-TPD) polymer sample before and after contact with some of the SiliaBond metal scavengers of FIG. 4 at 120° C. for 24 hours is shown in Table 5.

Summary of Palladium Content of P(BDT-TPD) after Treatment at 120° C. for 24 Hours with Three Different SiliaBond Metal Scavengers

TABLE 5

| P(BDT-TPD) polymer sample | Amount (ppm) | % Pd remaining |
|---|---|---|
| Initial | 2600 | — |
| Si-thiourea | 350 | 13% |
| Si-triamine | 350 | 13% |
| Si-DMT | <25 | 0% |

The palladium content of the P(BDT-FTT) polymer sample before and after contact with some of the SiliaBond metal scavengers of FIG. 4 at 120° C. for 24 hours is shown in Table 6.

Summary of Palladium Content of P(BDT-FTT) after Treatment at 120° C. for 24 Hours with Five Different SiliaBond Metal Scavengers

TABLE 6

| P(BDT-TPD) polymer sample | Amount (ppm) | % Pd remaining | % Recovery of Polymer |
|---|---|---|---|
| Initial | 6250 | 100% | N/A |
| Si-thiourea | 5295 | 85% | 89% |

TABLE 6-continued

| P(BDT-TPD) polymer sample | Amount (ppm) | % Pd remaining | % Recovery of Polymer |
|---|---|---|---|
| Si-triamine | <25 | 0% | 87% |
| Si-DMT | 270 | 4% | 84% |

Example 5

Embodiments of Method

Use of one embodiment of the method on P(BDT-TPD)

P(BDT-TPD) (0.129 grams) was taken up in chloroform (30 mL) and diatomaceous earth was added. The solvent was removed under reduced pressure using a rotary evaporator. The diatomaceous earth was ground using a mortar and pestle and the solid was added to a 34 mL stainless steel sample cell with an inlet injection port and a port for releasing solvent. The sample cell was loaded into a compression oven, heated to 100° C. and acetone was injected to bring the pressure to 1700 psi. After five minutes, the solvent was flushed with 44 mL acetone, and the process was repeated twelve times. This was followed by a series of ten hexane extractions (5 min heating time, 5 min extraction time, 44 mL hexane) carried out at a pressure of 1700 psi and 100° C. This particular solvent extraction was completed with a series of eight chloroform extractions (5 min heating time, 5 min extraction time, 44 mL chloroform) carried out at a pressure of 1700 psi and 100° C. The following amounts of samples were recovered from: acetone 0.02 g, hexane 0.044 g and chloroform 0.049 g. This resulted in an overall recovery of 0.113 g, or 88% yield.

Use of one embodiment of the method on P(BDT-FTT)

P(BDT-FTT) (0.091 g) was taken up in chloroform (30 mL) and diatomaceous earth was added. The solvent was removed under reduced pressure using the rotoevaporator. The diatomaceous earth was ground using a mortar and pestle and the solid was added to the 34 mL stainless steel sample cell with an inlet injection port and a port for releasing solvent. The sample cell was loaded into a compression oven, heated to 100° C. and acetone was injected to bring the pressure to 1700 psi. After five minutes, the solvent was flushed with 44 mL of acetone, and the process was repeated twelve times. This was followed by a series of ten hexane extractions (5 min heating time, 5 min extraction time, 44 mL hexane) carried out at a pressure of 1700 psi and 100° C. This particular solvent extraction was completed with a series of eight chloroform extractions (5 min heating time, 5 min extraction time, 44 mL chloroform) carried out at a pressure of 1700 psi and 100° C. All of the chloroform fractions were combined, and the solvent was removed under reduced pressure to afford 46 mg solid (51%).

The palladium content of the polymer sample before and after precipitation are shown in Table 7.

TABLE 7

Summary of palladium content before and after extraction using the conditions described above.

| Polymer Sample | Amt (ppm) | % Pd remaining |
|---|---|---|
| P(BDT-TPD) | | |
| Initial Content | 6040 | |
| After Chloroform Extraction | <25 | <1% |
| After Chloroform Extraction | <25 | <1% |

TABLE 7-continued

Summary of palladium content before and
after extraction using the conditions described above.

| Polymer Sample | Amt (ppm) | % Pd remaining |
|---|---|---|
| P(BDT-FTT) | | |
| Initial Content | 6250 | |
| After Chloroform Extraction A | 710 | 11% |
| After Chloroform Extraction B | 700 | 11% |
| After Chloroform Extraction C | 760 | 12% |
| After Chloroform Extraction D | 750 | 12% |
| After Chloroform Extraction E | 750 | 12% |

Although the embodiments described above dissolved the conjugated polymer in a fluid of chloroform, other solvents known to one skilled in the art can be used as well. In one embodiment the fluid that the conjugated polymer is dissolved in can be any liquid capable of dissolving the conjugated polymer. In one embodiment the liquid is a non-aqueous solvent. Examples of liquids capable of dissolving the conjugated polymer includes chloroform, chlorobenzene, xylenes, toluene, and tetrahydrofuran.

Also described above the agent added to the fluid to produce a solid sample is diatomaceous earth, other agents known to one skilled in the art can be used as well. In another embodiment the agent used is diatomaceous earth or silica gel. The agent used can be any agent capable of combining with the fluid followed by evaporation of the fluid to make a solid sample.

In yet another embodiment the grinding of the solid sample is performed by mortar and pestle. The produced fragmented solid samples have an average size between 1 μm to 500 μm.

Although the embodiments described above used a sequence of acetone, hexanes and chloroform to extract the purified polymer, other solvent combinations known to one skilled in the art can be used as well. In one embodiment the fluid that is used to purify the polymer can be any liquid capable of washing out impurities or dissolving the conjugated polymer. Examples of liquid capable of washing out impurities or dissolving the conjugated polymer includes chloroform, acetone, hexanes, chlorobenzene, xylenes, toluene, methanol, pentane, ethanol, isopropanol, tetrahydrofuran From example 5 above it was determined that different temperatures of solvent extraction on the fragmented solid sample can have a direct effect on the recovery of purified conjugated polymer and the removal of palladium impurities. As shown in Table 7 below, a polymer of P(BDT-FTT) was subjected to the method of example 5 with differing temperatures of solvent extraction.

Polymer P(BDT-FTT), Results of Varying the
Temperature of the High Pressure Extraction on the
Palladium Content

TABLE 8

| Temperature (° C.) | Recovery (%) | Pd content (ppm) | % Pd remaining |
|---|---|---|---|
| 100 | 72 | 2200 | 35% |
| 120 | 72 | 700 | 11% |
| 140 | 58 | 300 | 5% |
| 160 | 51 | 350 | 6% |
| 180 | 48 | 1000 | 16% |

Table 8 indicates that a temperature of 100° C. provided the greatest recovery of purified conjugated polymer but also resulted in the largest amount of residue palladium. It is theorized that the solvent extraction temperatures would range from 25 to 400° C.

In one embodiment the purified conjugated polymers are used as an active layer for organic solar cells. For the purified conjugated polymers to operate efficiently as an active layer the molecular weight of the polymers should be greater than (20 kDa). In one embodiment the molecular weight of the purified conjugated polymers ranges from 20 kDa to 100,000 kDa.

As important as the molecular weight polydispersity of the purified conjugated polymers are needed to ensure they operate efficiently as an active layer for the organic solar cells. For the purified conjugated polymers to operate efficiently as an active layer the polydispersity of the polymers should be less than (3.0). In one embodiment the polydispersity of the purified conjugated polymers ranges from 1.0 to 3.0.

As shown below in Table 8, the methods of example 5 produces superior molecular weight and polydispersity when compared to the methods of example 1 and example 2. For another comparison, the same polymer batches were tested using different purification techniques to eliminate batch-to-batch variability.

Gel Permeation Chromotography Data for the
Polymers

TABLE 9

| Polymer Batch | Purification Technique | $M_n$ (kDa) | PDI |
|---|---|---|---|
| P(BDT-TPD) -Batch 1 | Example 1 | 20.0 | 2.43 |
| P(BDT-TPD) -Batch 1 | Example 2 | 24.9 | 2.05 |
| P(BDT-TPD) -Batch 1 | Example 5 | 32.3 | 1.83 |
| P(BDT-TPD) -Batch 2 | Example 2 | 17.3 | 1.48 |
| P(BDT-TPD) -Batch 2 | Example 5 | 26.8 | 1.30 |
| P(BDT-FTT) -Batch 1 | Example 2 | 19.8 | 2.55 |
| P(BDT-FTT) -Batch 1 | Example 5 | 28.4 | 1.53 |
| P(BDT-FTT) -Batch 2 | Example 2 | 11.8 | 2.57 |
| P(BDT-FTT) -Batch 2 | Example 5 | 17.7 | 2.10 |
| P(BDT-FTT) -Batch 3 | Example 2 | 15.1 | 2.79 |
| P(BDT-FTT) -Batch 3 | Example 5 | 62.0 | 1.19 |

Figure 6:
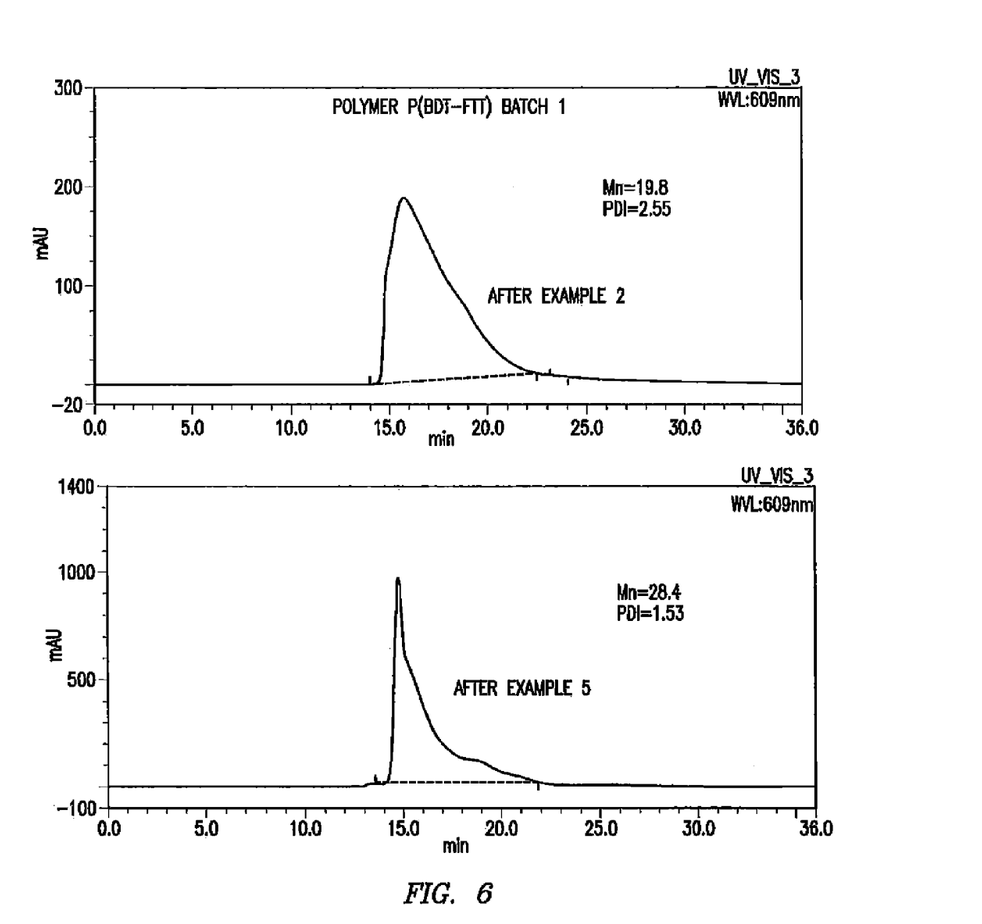
FIG. 6 depicts polymer P(BDT-FTT) Batch 1 after running purification technique examples 2 and 5.
Figure 7:
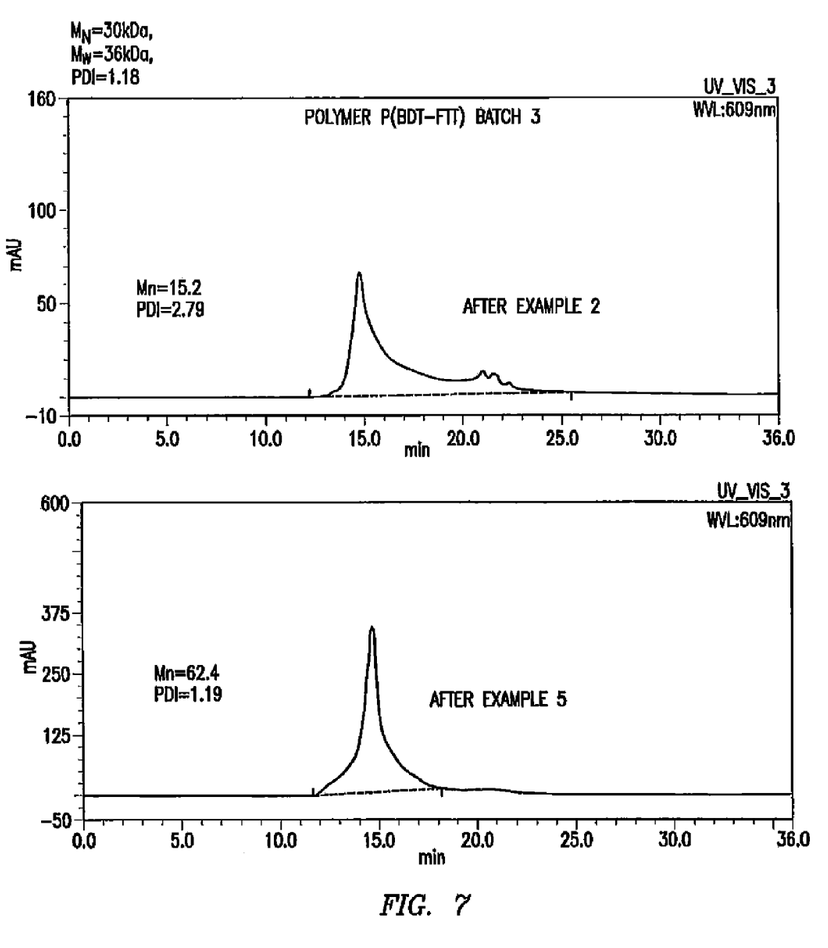
FIG. 7 depicts polymer P(BDT-FTT) Batch 3 after running purification technique examples 2 and 5.
Figure 8:
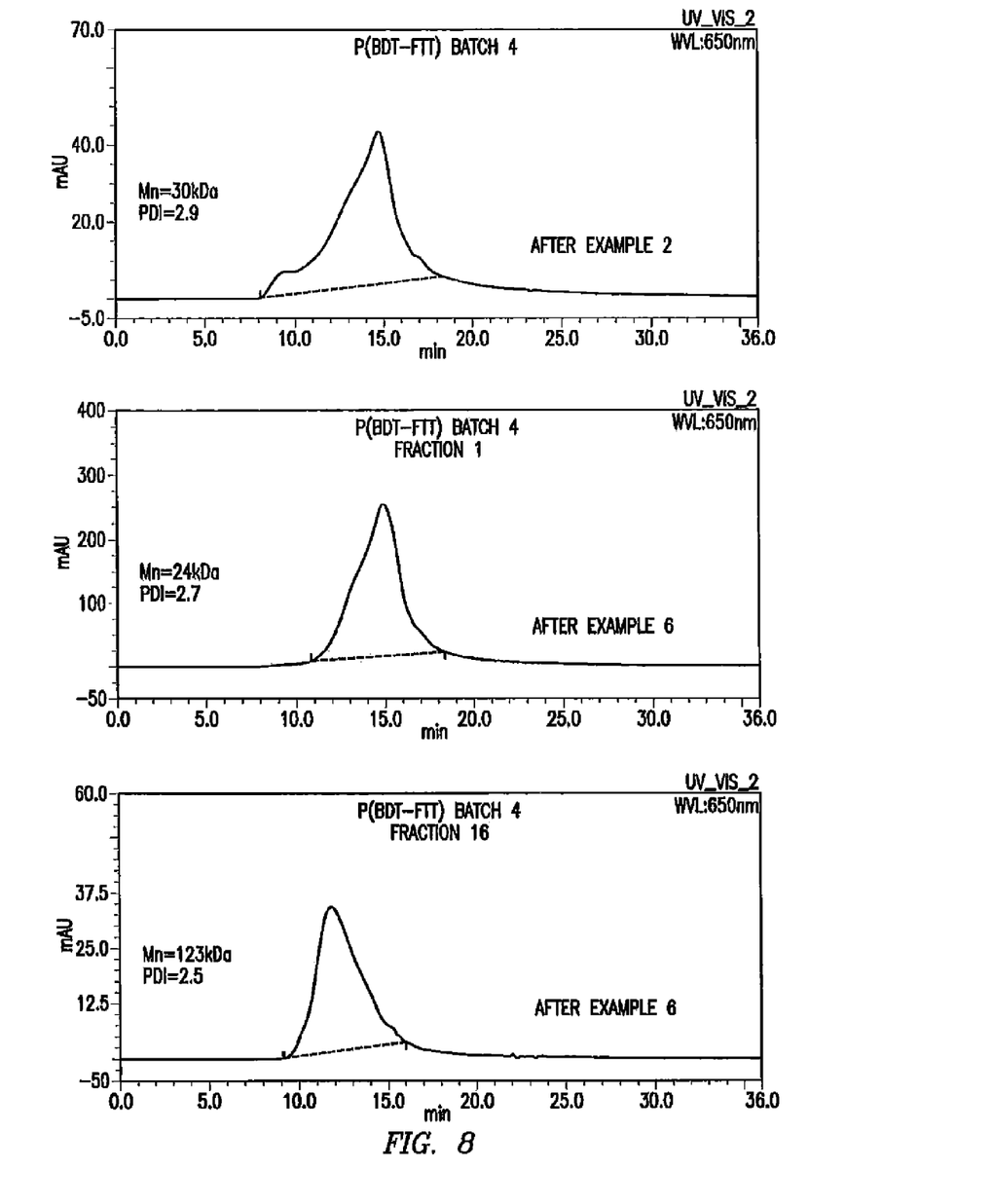
FIG. 8 depicts polymer P(+BDT-FTT) Batch 4 and Batch 4, Fractions 1 and 16, after running purification technique examples 2 and 6.

FIG. 6 and FIG. 7 are Gel Permeation Chromatography graphs of i) Polymer P(BDT-FTT) Batch 1 after running purification technique example 2 and example 5 and ii) Polymer P(BDT-FTT) Batch 3 after running purification technique example 2 and example 5. FIG. 8 is a Gel Permeation Chromatography graph of i) Polymer P(BTD-FTT) Batch 4 after running purification technique example 2 and ii) Polymer P(BTD-FTT Batch 4, Fractions 1 and 16, after running purification technique example 6.

In closing, it should be noted that the discussion of any reference is not an admission that it is prior art to the present invention, especially any reference that may have a publication date after the priority date of this application. At the same time, each and every claim below is hereby incorporated into this detailed description or specification as an additional embodiment of the present invention.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims while the description, abstract and drawings are not to be used to limit the scope of the invention. The invention is specifically intended to be as broad as the claims below and their equivalents.

The invention claimed is:

1. A method comprising:
dissolving a conjugated polymer in a solvent;
adding an agent to the solvent and evaporating the solvent to produce a solid sample;
grinding the solid sample to produce a fragmented solid sample; and
performing a solvent extraction, at a temperature greater than 90° C., on the fragmented solid sample to produce a purified conjugated polymer in a solvent;
wherein the agent is diatomaceous earth, silica gel, or sand.

2. The method of claim 1, wherein the solvent is selected from the group consisting of chloroform, acetone, hexanes chlorobenzene, xylenes, toluene, methanol, ethanol, isopropanol, tetrahydrofuran and combinations thereof.

3. The method of claim 1, wherein the purified conjugated polymer is used as an active layer of organic solar cells, organic field effect transistors, PLEDs or conjugated polymer based sensors.

4. The method of claim 1, wherein the solvent extraction is performed at an elevated pressure.

5. The method of claim 4, wherein the elevated pressure is greater than 1600 psi.

6. The method of claim 1, wherein the fragmented solid samples have an average size between 1 μm to 500 μm.

7. The method of claim 1, wherein the solvent extraction is at least a two stage solvent extraction.

8. The method of claim 7, wherein each stage uses a different solvent.

9. The method of claim 7, the solvent is selected from the group consisting of chloroform, acetone, hexanes, chlorobenzene, xylenes, toluene, methanol, ethanol, isopropanol, tetrahydrofuran, pentane and combinations thereof.

10. The method of claim 7, wherein each stage of the solvent extraction has at least 2 cycles.

11. A method comprising:
dissolving a conjugated polymer in a solvent;
adding an agent to the solvent to produce a solid sample;
grinding the solid sample to produce a fragmented solid sample; and
performing a three stage solvent extraction at an elevated temperature and an elevated pressure for less than six hours on the fragmented solid sample with three different solvents to produce at least 80 wt % of the conjugated polymer as a purified conjugated polymer in a solvent;
wherein the agent is diatomaceous earth, silica gel, or sand.

* * * * *